(12) United States Patent
Ueyama et al.

(10) Patent No.: US 9,775,238 B2
(45) Date of Patent: Sep. 26, 2017

(54) RESIN COMPOSITION, AND PREPREG AND LAMINATE USING THE SAME

(71) Applicant: MITSUBISHI GAS CHEMICAL COMPANY, INC., Tokyo (JP)

(72) Inventors: Daisuke Ueyama, Tokyo (JP); Masanobu Sogame, Tokyo (JP); Chisato Saito, Tokyo (JP); Yoshinori Mabuchi, Tokyo (JP); Yoshihiro Kato, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 550 days.

(21) Appl. No.: 14/356,266

(22) PCT Filed: Oct. 26, 2012

(86) PCT No.: PCT/JP2012/077738
§ 371 (c)(1),
(2) Date: May 5, 2014

(87) PCT Pub. No.: WO2013/069479
PCT Pub. Date: May 16, 2013

(65) Prior Publication Data
US 2014/0349089 A1 Nov. 27, 2014

(30) Foreign Application Priority Data
Nov. 7, 2011 (JP) ................................. 2011-243162

(51) Int. Cl.
| H05K 1/03 | (2006.01) |
| C08J 5/24 | (2006.01) |
| C08G 73/06 | (2006.01) |
| C08G 73/12 | (2006.01) |
| C08L 79/04 | (2006.01) |
| C09K 5/14 | (2006.01) |

(52) U.S. Cl.
CPC ....... *H05K 1/0373* (2013.01); *C08G 73/0655* (2013.01); *C08G 73/12* (2013.01); *C08J 5/24* (2013.01); *C08L 79/04* (2013.01); *C09K 5/14* (2013.01); *C08J 2363/00* (2013.01); *C08J 2379/04* (2013.01); *C08K 2201/003* (2013.01); *Y10T 428/24802* (2015.01); *Y10T 428/24893* (2015.01); *Y10T 428/25* (2015.01); *Y10T 442/2475* (2015.04)

(58) Field of Classification Search
CPC ................ H05K 1/0366; H05K 1/0373; Y10T 428/24802; Y10T 428/24893
See application file for complete search history.

(56) References Cited

U.S. PATENT DOCUMENTS

| 7,601,429 B2 * | 10/2009 | Kato ..................... B32B 15/08 428/447 |
| 2009/0017316 A1 | 1/2009 | Kato et al. |
| 2010/0227170 A1 | 9/2010 | Endo et al. |
| 2012/0111621 A1 | 5/2012 | Ohigashi et al. |

FOREIGN PATENT DOCUMENTS

| EP | 1961554 | 8/2008 |
| EP | 2684904 | 1/2014 |
| EP | 2716676 | 4/2014 |
| EP | 2716709 | 4/2014 |
| JP | 07-165949 | 6/1995 |
| JP | 10-146917 | 6/1998 |
| JP | 2000-344917 | 12/2000 |
| JP | 2001-294689 | 10/2001 |
| JP | 2001-348488 | 12/2001 |
| JP | 2007-045984 | 2/2007 |
| JP | 2009-35728 | 2/2009 |
| JP | 2009-051978 | 3/2009 |
| JP | 2010-031263 | 2/2010 |
| JP | 2010-100803 | 5/2010 |
| JP | 2010-174242 | 8/2010 |
| JP | 2012-158637 | 8/2012 |
| JP | 2012-211269 | 11/2012 |
| TW | 201109359 | 3/2011 |
| WO | 2008/126411 | 10/2008 |
| WO | 2011/010672 | 1/2011 |
| WO | 2012/165240 | 12/2012 |
| WO | 2012/165423 | 12/2012 |

OTHER PUBLICATIONS

International Preliminary Report on Patentability in PCT/JP2012/077738 May 13, 2014, including English language version.
International Search Report in PCT/JP2012/077738 issued Jan. 22, 2013.

* cited by examiner

*Primary Examiner* — Gerard Higgins
(74) *Attorney, Agent, or Firm* — Greenblum & Bernstein, P.L.C.

(57) ABSTRACT

The present invention provides a resin composition with which a laminate, a printed wiring board, and the like that not only have high thermal conductivity but have good moldability with the occurrence of cracks and voids suppressed can be implemented simply and with good reproducibility, and a prepreg, a laminate, a metal foil-clad laminate, and the like using the same. The resin composition of the present invention is a resin composition comprising at least a cyanate ester compound (A), an epoxy resin (B), a first inorganic filler (C), and a second filler (D), wherein an average particle diameter ratio of the first inorganic filler (C) to the second inorganic filler (D) is in the range of 1:0.02 to 1:0.2.

21 Claims, No Drawings

RESIN COMPOSITION, AND PREPREG AND LAMINATE USING THE SAME

TECHNICAL FIELD

The present invention relates to a resin composition, a prepreg, and a laminate, and particularly to a resin composition for a printed wiring board having high thermal conductivity.

BACKGROUND ART

In recent years, higher integration, higher functionality, and higher density mounting of semiconductors, which are widely used in electronic equipment, communication instruments, personal computers, and the like, have been increasingly accelerated, and the demand for the properties of printed wiring boards has increased more than ever before. Particularly, heat dissipation techniques for printed wiring boards against the heat generation of semiconductors have been required. This is because with higher functionality of semiconductors, the amount of heat generated from the semiconductors has increased, and because configurations in which heat accumulates easily inside have been provided due to the influence of higher integration and higher density mounting.

Generally, thermosetting resins, such as epoxy resins, used for the insulating layers of printed wiring boards have low thermal conductivity in themselves. Therefore, in order to improve the thermal conductivity of printed wiring boards, a thermally conductive resin composition is proposed in which 80 to 95% by weight of a mixed filler (inorganic filler) having a predetermined particle diameter distribution is blended with a thermosetting resin to attain the thermal conductivity of the cured product to 3 to 10 W/mK (see Patent Literature 1).

CITATION LIST

Patent Literature

Patent Literature 1: Japanese Patent Laid-Open No. 2001-348488

SUMMARY OF INVENTION

Technical Problem

However, when a thermosetting resin composition is highly filled with an inorganic filler as in the above Patent Literature 1, the thermal conductivity can be improved, but the volume ratio of the thermosetting resin decreases. Therefore, the moldability deteriorates, and cracks and voids are likely to occur between the resin and the inorganic filler. In addition, deterioration of solder heat resistance properties after moisture absorption and a decrease in elastic modulus occur, and further, the adhesiveness between the resin and the inorganic filler is insufficient, resulting in a problem of a decrease in the metal foil peel strength.

The present invention has been made in view of the above problems, and it is an object of the present invention to provide a resin composition with which a laminate, a printed wiring board, and the like that not only have high thermal conductivity but have good moldability with the occurrence of cracks and voids suppressed can be implemented simply and with good reproducibility.

It is another object of the present invention to provide a resin composition with which a laminate, a printed wiring board, and the like that not only have excellent thermal conductivity and moldability but also have excellent metal foil peel strength, solder heat resistance properties after moisture absorption, bending strength, elastic modulus, and glass transition temperature can be implemented simply and with good reproducibility, and a prepreg, a laminate, and a metal foil-clad laminate using the same.

Solution to Problem

The present inventors have studied diligently for solving such problems, and, as a result, found that the above problems are solved by using a resin composition comprising at least a cyanate ester compound (A), an epoxy resin (B), a first inorganic filler (C), and a second inorganic filler (D), wherein the average particle diameter ratio of the first inorganic filler (C) to the second inorganic filler (D) is in the range of 1:0.02 to 1:0.2, leading to the completion of the present invention.

Specifically, the present invention provides the following <1> to <23>.

<1> A resin composition comprising at least a cyanate ester compound (A), an epoxy resin (B), a first inorganic filler (C), and a second inorganic filler (D), wherein an average particle diameter ratio of the first inorganic filler (C) to the second inorganic filler (D) is in the range of 1:0.02 to 1:0.2.

<2> The resin composition according to above <1>, wherein a content ratio of the first inorganic filler (C) to the second inorganic filler (D) is in the range of 1:0.03 to 1:0.5.

<3> The resin composition according to above <1> or <2>, wherein a total content of the first inorganic filler (C) and the second inorganic filler (D) is 351 to 900 parts by mass based on 100 parts by mass of a total of the cyanate ester compound (A) and the epoxy resin (B).

<4> The resin composition according to above <1> or <2>, wherein a total content of the first inorganic filler (C) and the second inorganic filler (D) is 701 to 900 parts by mass based on 100 parts by mass of a total of the cyanate ester compound (A) and the epoxy resin (B).

<5> The resin composition according to any one of above <1> to <4>, wherein the first inorganic filler (C) has an average particle diameter of 0.5 to 10 μm.

<6> The resin composition according to any one of above <1> to <5>, wherein the second inorganic filler (D) has an average particle diameter of 0.01 to 2 μm.

<7> The resin composition according to any one of above <1> to <6>, wherein the second inorganic filler (D) is spherical.

<8> The resin composition according to any one of above <1> to <7>, wherein the second inorganic filler (D) is at least one selected from the group consisting of alumina, magnesium oxide, aluminum hydroxide, boron nitride, aggregated boron nitride, silicon nitride, a molybdenum compound, zinc borate, and aluminum nitride.

<9> The resin composition according to above <8>, wherein the second inorganic filler (D) is at least one selected from the group consisting of alumina, magnesium oxide, boron nitride, and aluminum nitride.

<10> The resin composition according to any one of above <1> to <9>, wherein the first inorganic filler (C) and the second inorganic filler (D) are contained in an amount of 50% by volume or more and 80% by volume or less in total based on a total volume of the resin composition.

<11> The resin composition according to any one of above <1> to <10>, wherein the first inorganic filler (C) is one selected from the group consisting of alumina, magnesium oxide, aluminum hydroxide, boron nitride, aggregated boron nitride, silicon nitride, a molybdenum compound, zinc borate, and aluminum nitride.

<12> The resin composition according to above <11>, wherein the first inorganic filler (C) is one selected from the group consisting of alumina, magnesium oxide, boron nitride, and aluminum nitride.

<13> The resin composition according to any one of above <1> to <12>, wherein the cyanate ester compound (A) is at least one selected from the group consisting of a naphthol aralkyl-based cyanate ester compound represented by the following general formula (1), a novolac-based cyanate ester compound represented by the following general formula (2), and a biphenyl aralkyl-based cyanate ester compound represented by the following general formula (3):

[Formula 1]

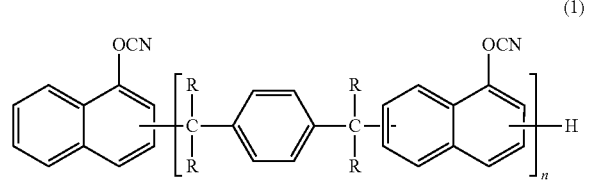

(1)

wherein R each independently represents a hydrogen atom or a methyl group, and n represents an integer of 1 to 50;

[Formula 2]

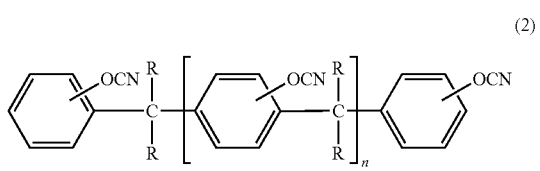

(2)

wherein R each independently represents a hydrogen atom or a methyl group, and n represents an integer of 1 to 50;

[Formula 3]

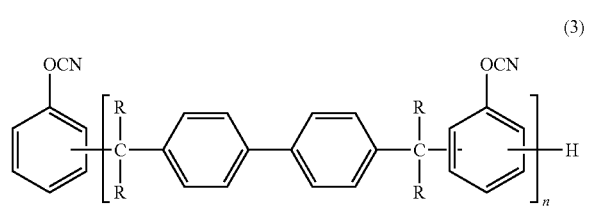

(3)

wherein R each independently represents a hydrogen atom or a methyl group, and n represents an integer of 1 to 50.

<14> The resin composition according to above <13>, wherein the cyanate ester compound is the naphthol aralkyl-based cyanate ester compound represented by the above general formula (1).

<15> The resin composition according to any one of above <1> to <14>, wherein the cyanate ester compound (A) is contained in an amount of 10 to 90 parts by mass based on 100 parts by mass of the total of the cyanate ester compound (A) and the epoxy resin (B).

<16> The resin composition according to any one of above <1> to <15>, further comprising a silane coupling agent (E).

<17> The resin composition according to above <16>, wherein the silane coupling agent is contained in an amount of 3 to 20 parts by mass based on 100 parts by mass of the total of the cyanate ester compound (A) and the epoxy resin (B).

<18> The resin composition according to any one of above <1> to <17>, further comprising a maleimide compound (F).

<19> The resin composition according to above <18>, wherein the maleimide compound (F) is contained in an amount of 5 to 75 parts by mass based on 100 parts by mass of a total of the cyanate ester compound (A) and the maleimide compound (F).

<20> A prepreg obtained by impregnating or coating a substrate with the resin composition according to any one of above <1> to <19>.

<21> A laminate obtained by curing the prepreg according to above <20>.

<22> A metal foil-clad laminate obtained by laminating and curing the prepreg according to above <20> and metal foil.

<23> A printed wiring board comprising an insulating layer and a conductor layer formed on a surface of the insulating layer, wherein
the insulating layer comprises the resin composition according to any one of above <1> to <19>.

Advantageous Effects of Invention

According to the present invention, a laminate, a printed wiring board, and the like that not only have high thermal conductivity but have good moldability with the occurrence of cracks and voids suppressed can be implemented simply and with good reproducibility. In addition, according to a preferred aspect of the present invention, a printed wiring board, a metal foil-clad laminate, and the like that have high performance not only in thermal conductivity and moldability but also in glass transition temperature, metal foil peel strength, solder heat resistance, solder heat resistance properties after moisture absorption, water absorption rate, bending strength, elastic modulus, and the like can be implemented.

DESCRIPTION OF EMBODIMENTS

Embodiments of the present invention will be described below. The following embodiments are illustrations for explaining the present invention, and the present invention is not limited only to the embodiments.

A resin composition in this embodiment contains at least a cyanate ester compound (A), an epoxy resin (B), a first inorganic filler (C), and a second inorganic filler (D), wherein the average particle diameter ratio of the first inorganic filler (C) to the second inorganic filler (D) is in the range of 1:0.02 to 1:0.2.

As the cyanate ester compound (A) used in the resin composition in this embodiment, any known compound can be appropriately used provided that it is a compound represented by the general formula R—O—CN, wherein R is an organic group. The type of the cyanate ester compound (A) is not particularly limited. Specific examples thereof include, but are not particularly limited to, naphthol aralkyl-based cyanate ester compounds represented by the following general formula (1), novolac-based cyanate esters represented by the following general formula (2), biphenyl aralkyl-based cyanate esters represented by the following general formula (3), 1,3-dicyanatobenzene, 1,4-dicyanatobenzene, 1,3,5-tricyanatobenzene, bis(3,5-dimethyl 4-cyanatophenyl)methane, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, 2,2'-bis(4-cyanatophenyl)propane, bis(4-cyanatophenyl)ether, bis(4-cyanatophenyl)thioether, bis(4-cyanatophenyl)sulfone, 2,2'-bis(4-cyanatophenyl)propane, bis(3,5-dimethyl, 4-cyanatophenyl)methane, and phenol novolac-based cyanate ester compounds. Among these, in terms of excellent flame retardancy, high curability, and a low thermal expansion coefficient of the cured product, naphthol aralkyl-based cyanate ester compounds represented by the following general formula (1), novolac-based cyanate ester compounds represented by the following general formula (2), and biphenyl aralkyl-based cyanate ester compounds represented by the following general formula (3) are preferred, and naphthol aralkyl-based cyanate ester compounds represented by the following general formula (1) are more preferred.

[Formula 4]

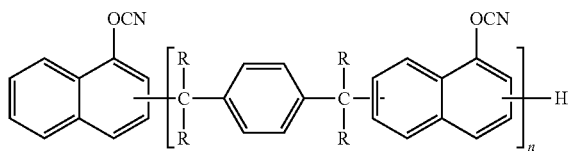

(1)

wherein R each independently represents a hydrogen atom or a methyl group, and n represents an integer of 1 to 50.

[Formula 5]

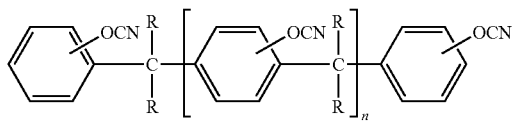

(2)

wherein R each independently represents a hydrogen atom or a methyl group, and n represents an integer of 1 to 50.

[Formula 6]

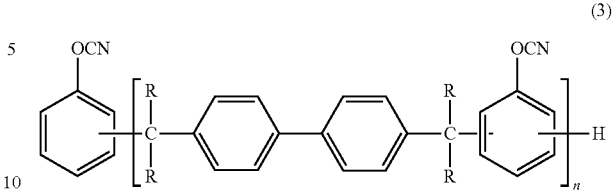

(3)

wherein R each independently represents a hydrogen atom or a methyl group, and n represents an integer of 1 to 50.

Among the naphthol aralkyl-based cyanate ester compounds represented by the above general formula (1), α-naphthol aralkyl-based cyanate ester compounds in which the substituent R is hydrogen can be particularly preferably used because they have not only excellent heat resistance but also excellent properties such as water absorbency and solder heat resistance properties after moisture absorption.

One cyanate ester compound (A) can be used alone or two or more cyanate ester compounds (A) can be used in appropriate combination according to the purpose. In addition, as the cyanate ester compounds represented by the above general formulas (1) to (3), two or more cyanate ester compounds in which n in the above general formulas (1) to (3) are different from each other can also be appropriately mixed and used.

The content of the cyanate ester compound (A) in the resin composition can be appropriately set according to the intended application and performance, and is not particularly limited. In terms of the curability and solvent solubility of the resin composition, and further the heat resistance of the cured product thereof, and the like, the content of the cyanate ester compound (A) is preferably 10 to 90 parts by mass, more preferably 30 to 70 parts by mass, based on 100 parts by mass of the total of the cyanate ester compound (A) and the epoxy resin (B).

For the epoxy resin (B) used in the resin composition in this embodiment, any known compound can be used provided that it is a compound having two or more epoxy groups in one molecule. The type of the epoxy resin (B) is not particularly limited. Because of an increased interest in environmental problems in recent years, non-halogen-based epoxy resins are preferred. Specific examples thereof include, but are not particularly limited to, bisphenol A-based epoxy resins, bisphenol E-based epoxy resins, bisphenol F-based epoxy resins, bisphenol S-based epoxy resins, phenol novolac-based epoxy resins, cresol novolac-based epoxy resins, anthracene-based epoxy resins, bisphenol A novolac-based epoxy resins, trifunctional phenol-based epoxy resins, tetrafunctional phenol-based epoxy resins, glycidyl ester-based epoxy resins, aralkyl novolac-based epoxy resins, dicyclopentadiene-based epoxy resins, polyol-based epoxy resins, naphthalene-based epoxy resins, biphenyl-based epoxy resins, phenol aralkyl-based epoxy resins, biphenyl aralkyl-based epoxy resins, naphthol aralkyl-based epoxy resins, alicyclic epoxy resins, polyol-based epoxy resins, phosphorus-containing epoxy resins, glycidyl amines, glycidyl esters, compounds obtained by epoxidizing the double bond of butadiene or the like, and compounds obtained by the reaction of hydroxyl group-containing silicone resins with epichlorohydrin. Among these, in terms of excellent heat resistance and excellent properties such as water absorbency and solder heat resistance properties after moisture absorption, bisphenol A-based epoxy resins, bisphenol F-based epoxy resins, phenol novolac-based epoxy resins, cresol novolac-based epoxy resins, bisphenol A novolac-based epoxy resins, biphenyl-based epoxy resins, phenol aralkyl-based epoxy resins, biphenyl aralkyl-based epoxy resins, and naphthol aralkyl-based epoxy resins are preferred, and phenol aralkyl-based epoxy resins, biphenyl aralkyl-based epoxy resins, and naphthol aralkyl-based epoxy resins are more preferred. One of these epoxy resins (B) can be used alone or two or more of these epoxy resins (B) can be used in appropriate combination according to the purpose.

The content of the epoxy resin (B) in the resin composition can be appropriately set according to the intended application and performance, and is not particularly limited. In terms of the heat resistance, thermal conductivity, and water absorbency of the resin composition and the cured product thereof, the content of the epoxy resin (B) is preferably 10 to 90 parts by mass, more preferably 30 to 70 parts by mass, based on 100 parts by mass of the total of the cyanate ester compound (A) and the epoxy resin (B).

The resin composition in this embodiment contains at least two or more inorganic fillers having different average particle diameters, that is, the first inorganic filler (C) having a large average particle diameter and the second inorganic filler (D) having a smaller average particle diameter than the first inorganic filler (C).

Here, in the resin composition in this embodiment, in terms of improving the filling rate of the inorganic fillers and increasing the moldability of the resin composition, it is required that the average particle diameter ratio of the first inorganic filler (C) to the second inorganic filler (D) is in the range of 1:0.02 to 1:0.2. The reason is the following: the inorganic filler having a smaller average particle diameter enters the gaps between the particles of the inorganic filler having a larger average particle diameter, and thus, the volume content (hereinafter also simply referred to as "filling rate") of the inorganic fillers in the resin composition can be increased to improve thermal conductivity. Here, the average particle diameter ratio of the first inorganic filler (C) to the second inorganic filler (D) is more preferably in the range of 1:0.025 to 1:0.18, further preferably in the range of 1:0.05 to 1:0.14.

The average particle diameter herein means a median diameter (D50), and is a value at which the larger side and the smaller side are equivalent when the measured particle size distribution of a powder is divided into two. More specifically, the average particle diameter (D50) herein means a value at which 50% of the total volume is reached in volume summation from a small particle when the particle size distribution of a powder dispersed in methyl ethyl ketone is measured by a laser diffraction scattering particle size distribution measuring apparatus under conditions in Examples described later.

The first inorganic filler (C) used in the resin composition in this embodiment has a larger average particle diameter than the second inorganic filler (D). The type of the first inorganic filler (C) can be appropriately selected and used from among those generally used in insulating resins for printed wiring boards and laminates without particular limitation. Specific examples thereof include, but are not particularly limited to, silicas, such as natural silica, fused silica, synthetic silica, amorphous silica, and hollow silica, white carbon, titanium white, AEROSIL, silicone composite powders, silicone resin powders, alumina, zinc oxide, magnesium oxide, zirconium oxide, aluminum hydroxide, boehmite, boron nitride, aggregated boron nitride, silicon nitride, aluminum nitride, molybdenum compounds, such as molybdenum oxide and zinc molybdate, zinc borate, aluminum nitride, barium sulfate, heat-treated products of aluminum hydroxide (products obtained by heat-treating aluminum hydroxide to decrease part of the water of crystallization), metal hydrates, such as magnesium hydroxide, zinc stannate, clay, kaolin, talc, fired clay, fired kaolin, fired talc, natural mica, synthetic mica, E-glass, A-glass, NE-glass, C-glass, L-glass, D-glass, S-glass, M-glass G20, glass short fibers (including glass fine powders, such as E-glass, T-glass, D-glass, S-glass, and Q-glass), hollow glass, and spherical glass. Among these, in terms of thermal conductivity and filling rate, alumina, magnesium oxide, aluminum hydroxide, boron nitride, aggregated boron nitride, silicon nitride, molybdenum compounds, zinc borate, and aluminum nitride are preferred, and alumina, magnesium oxide, boron nitride, and aluminum nitride are more preferred for the first inorganic filler (C).

As long as the average particle diameter ratio of the first inorganic filler (C) to the second inorganic filler (D) being in the range of 1:0.02 to 1:0.2 is satisfied, one first inorganic filler (C) can be used alone, or two or more first inorganic fillers (C) can be used in appropriate combination.

The average particle diameter of the first inorganic filler (C) is not particularly limited, but is preferably 0.5 to 10 µm, more preferably 1.5 to 7 µm, in terms of dispersibility and filling rate. The shape of the first inorganic filler (C) is not particularly limited, but is preferably spherical in terms of decreasing specific surface area.

The second inorganic filler (D) used in the resin composition in this embodiment has a smaller average particle diameter than the first inorganic filler (C). The type of the second inorganic filler (D) can be appropriately selected and used from among those generally used in insulating resins for printed wiring boards and laminates without particular limitation. Specific examples thereof include, but are not particularly limited to, silicas, such as natural silica, fused silica, synthetic silica, amorphous silica, and hollow silica, white carbon, titanium white, AEROSIL, silicone composite powders, silicone resin powders, alumina, zinc oxide, magnesium oxide, zirconium oxide, aluminum hydroxide, boehmite, boron nitride, aggregated boron nitride, silicon nitride, aluminum nitride, molybdenum compounds, such as molybdenum oxide and zinc molybdate, zinc borate, aluminum nitride, barium sulfate, heat-treated products of aluminum hydroxide (products obtained by heat-treating aluminum hydroxide to decrease part of the water of crystallization), metal hydrates, such as magnesium hydroxide, zinc stannate, clay, kaolin, talc, fired clay, fired kaolin, fired talc, natural mica, synthetic mica, E-glass, A-glass, NE-glass, C-glass, L-glass, D-glass, S-glass, M-glass G20, glass short fibers (including glass fine powders, such as E-glass, T-glass, D-glass, S-glass, and Q-glass), hollow glass, and spherical glass. Among these, in terms of thermal conductivity and filling rate, alumina, magnesium oxide, aluminum hydroxide, boron nitride, aggregated boron nitride, silicon nitride, molybdenum compounds, zinc borate, and aluminum nitride are preferred, and alumina, magnesium oxide, boron nitride, and aluminum nitride are more preferred.

As long as the average particle diameter ratio of the first inorganic filler (C) to the second inorganic filler (D) being in the range of 1:0.02 to 1:0.2 is satisfied, one second inorganic filler (D) can be used alone, or two or more second inorganic fillers (D) can be used in appropriate combination.

The average particle diameter of the second inorganic filler (D) is not particularly limited, but is preferably 0.01 to 2 μm, more preferably 0.1 to 1.0 μm, in terms of dispersibility and filling rate. The shape of the second inorganic filler (D) is not particularly limited, but is preferably spherical in terms of increasing the filling rate.

In the resin composition in this embodiment, the content of the first inorganic filler (C) and the second inorganic filler (D) can be appropriately set, and is not particularly limited. In terms of the balance between thermal conductivity and moldability, the total content of the first inorganic filler (C) and the second inorganic filler (D) is preferably 351 to 900 parts by mass, more preferably 701 to 900 parts by mass, based on 100 parts by mass of the total of the cyanate ester compound (A) and the epoxy resin (B).

In addition, the total volume of the first inorganic filler (C) and the second inorganic filler (D) is preferably 50% by volume or more and 80% by volume or less based on the total volume of the resin composition because addition of the first inorganic filler (C) and the second inorganic filler (D) in such a content can dramatically improve the thermal conductivity.

Similarly, in the resin composition in this embodiment, the ratio of the content of the first inorganic filler (C) to the content of the second inorganic filler (D) can be appropriately set, and is not particularly limited. In terms of increasing the filling rate, the ratio is preferably 1:0.03 to 1:0.5. At such a ratio, there is a tendency that the gaps between the large particles are sufficiently filled with the small particles, and the resin composition is densely filled with the large and small particles each other. In addition, at such a ratio, there is a tendency that the flowability of the resin composition is improved, and molding failure, such as the occurrence of voids during prepreg molding, is reduced.

Here, the resin composition in this embodiment may further contain a silane coupling agent (E) as required. The silanol group of the silane coupling agent (E) has excellent affinity and reactivity with materials having a hydroxyl group on a surface, and therefore is effective for organic matter-inorganic matter bonds. For example, when the particle surface of an inorganic filler reacts with the silane coupling agent, there is a tendency that the adhesiveness between a thermosetting resin and the inorganic filler is especially significantly increased. Therefore, by containing the silane coupling agent (E) in the resin composition in this embodiment, there is a tendency that the metal foil peel strength, bending strength, elastic modulus, and solder heat resistance properties after moisture absorption of the obtained printed wiring board and the like are increased, and there is a tendency that a cured product having excellent appearance is easily obtained.

As the silane coupling agent (E) used here, those generally used for the surface treatment of inorganic matter can be preferably used, and the type of the silane coupling agent (E) is not particularly limited. Specific examples thereof include, but are not particularly limited to, aminosilane-based silane coupling agents, such as γ-aminopropyltriethoxysilane and N-β-(aminoethyl)-γ-aminopropyltrimethoxysilane, epoxysilane-based silane coupling agents, such as γ-glycidoxypropyltrimethoxysilane, vinylsilane-based silane coupling agents, such as γ-methacryloxypropyltrimethoxysilane, cationic silane-based silane coupling agents, such as N-β-(N-vinylbenzylaminoethyl)-γ-aminopropyltrimethoxysilane hydrochloride, and phenylsilane-based silane coupling agents. One silane coupling agent can be used alone, or two or more silane coupling agents can be used in appropriate combination.

In the resin composition in this embodiment, the content of the silane coupling agent (E) can be appropriately set, and is not particularly limited. In terms of increasing the above-described adhesiveness, the content of the silane coupling agent (E) is preferably 3 to 30 parts by mass based on 100 parts by mass of the total of the cyanate ester compound (A) and the epoxy resin (B).

In addition, the resin composition in this embodiment may further contain a wetting and dispersing agent as required. By containing a wetting and dispersing agent, there is a tendency that the dispersibility of the inorganic fillers is increased. As the wetting and dispersing agent, those generally used for paints can be preferably used, and the type of the wetting and dispersing agent is not particularly limited. Specific examples thereof include, but are not particularly limited to, Disperbyk-110, 111, 161, and 180, BYK-W996, BYK-W9010, BYK-W903, BYK-W161, and BYK-W940 manufactured by BYK Japan KK. One wetting and dispersing agent can be used alone, or two or more wetting and dispersing agents can be used in appropriate combination.

In the resin composition in this embodiment, the content of the wetting and dispersing agent can be appropriately set, and is not particularly limited. In terms of increasing dispersibility, the content of the wetting and dispersing agent is preferably 1 to 10 parts by mass based on 100 parts by mass of the total of the cyanate ester compound (A) and the epoxy resin (B).

Further, the resin composition in this embodiment may further contain a maleimide compound (F) as required. By containing the maleimide compound (F), the cyanate ester compound (A) reacts with the maleimide group, and there is a tendency that the crosslinking density is thus increased thereby to improve the heat resistance and elastic modulus of the obtained printed wiring board and the like. As the maleimide compound (F), any known compound can be appropriately used provided that it has one or more maleimide groups in one molecule. The type of the maleimide compound (F) is not particularly limited. Specific examples thereof include, but are not particularly limited to, N-phenylmaleimide, N-hydroxyphenylmaleimide, bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, tris(4-maleimidephenyl)methane, and maleimide compounds represented by the following general formula (4). One of these maleimide compounds can be used alone, or two or more of these maleimide compounds can be used in appropriate combination. The maleimide compound (F) is not limited to those in the form of a monomer, and may be in the form of a prepolymer. It may be also in the form of a prepolymer of a bismaleimide compound and an amine compound or the like. Among these, in terms of heat resistance, bis(4-maleimidephenyl)methane, maleimide compounds represented by the following general formula (4), 2,2-bis{4-(4-maleimidephenoxy)-phenyl}propane, and bis(3-ethyl-5-methyl-4-maleimidephenyl)methane are preferred.

[Formula 7]

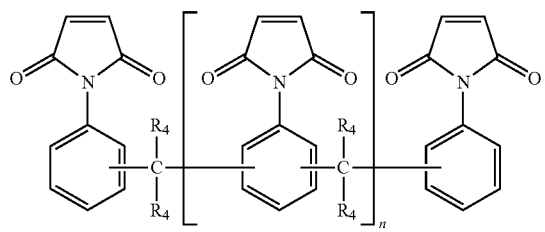

(4)

wherein $R_4$ each independently represents a hydrogen atom or a methyl group, and n represents an integer of 1 or more.

In the resin composition in this embodiment, the content of the maleimide compound (F) can be appropriately set, and is not particularly limited. In terms of heat resistance and elastic modulus, the content of the maleimide compound (F) is preferably 5 to 75 parts by mass, more preferably 10 to 70 mass, based on 100 parts by mass of the total of the cyanate ester compound (A) and the maleimide compound.

The resin composition in this embodiment may comprise components other than the above-described components, if needed, as long as the desired properties are not impaired. Examples of such optional blending materials include various polymer compounds, such as thermosetting resins, thermoplastic resins, and oligomers thereof, and elastomers, a curing accelerator for appropriately adjusting curing speed, a flame-retardant compound, and various additives, other than the above. These can be used without particular limitation as long as they are those generally used.

The curing accelerator can be used without particular limitation as long as it is one generally used as a curing accelerator for the cyanate ester compound (A) and the epoxy resin (B). The type of the curing accelerator is not particularly limited. Specific examples thereof include, but are not particularly limited to, organometallic salts of copper, zinc, cobalt, nickel, and the like, imidazoles and derivatives thereof, and tertiary amines. One curing accelerator can be used alone, or two or more curing accelerators can be used in appropriate combination. The amount of the curing accelerator used can be appropriately adjusted in terms of the degree of cure of the resins, the viscosity of the resin composition, and the like, and is not particularly limited. The amount of the curing accelerator used is usually about 0.01 to 15 parts by mass based on 100 parts by mass of the total amount of the resins.

In addition, examples of the flame-retardant compound include, but are not particularly limited to, bromine compounds, such as 4,4'-dibromobiphenyl, phosphorus compounds, such as phosphate esters, melamine phosphate, and phosphorus-containing epoxy resins, nitrogen-containing compounds, such as melamine and benzoguanamine, oxazine ring-containing compounds, and silicon-based compounds. One flame-retardant compound can be used alone, or two or more flame-retardant compounds can be used in appropriate combination.

On the other hand, specific examples of the various additives include, but are not particularly limited to, an ultraviolet absorbing agent, an antioxidant, a photopolymerization initiator, a fluorescent brightening agent, a photosensitizer, a dye, a pigment, a thickening agent, a lubricant, a defoaming agent, a dispersing agent other than the above wetting and dispersing agent, a leveling agent, a brightening agent, and a polymerization inhibitor. One of these optional blending materials can be used alone, or two or more of these optional blending materials can be used in combination.

The resin composition in this embodiment may comprise an organic solvent as required. In other words, the resin composition in this embodiment can be used as a form (resin varnish) in which at least part, preferably all, of the above-described cyanate ester compound (A) and epoxy resin (B) are dissolved in or compatible with an organic solvent. Since the viscosity of the resin composition can be decreased by the use of the organic solvent, there is a tendency that the handling properties are improved, and that the impregnation properties for glass cloth are increased. The type of the organic solvent is not particularly limited as long as it is capable of dissolving or compatible with at least part of the above-described cyanate ester compound (A) and epoxy resin (B). Specific examples thereof include, but are not limited to, ketones, such as acetone, methyl ethyl ketone, methyl isobutyl ketone, and cyclohexanone, aromatic hydrocarbons, such as benzene, toluene, and xylene, and amides, such as dimethylformamide and dimethylacetamide. One of these organic solvents can be used alone, or two or more of these organic solvents can be used in appropriate combination.

The resin composition in this embodiment can be prepared by stirring and mixing the above-described cyanate ester compound (A), epoxy resin (B), first inorganic filler, (C) and second inorganic filler (D) according to an ordinary method. The method for preparing the resin composition in this embodiment is not particularly limited. Examples thereof include a method including blending the first inorganic filler (C) and the second inorganic filler (D) with the epoxy resin (B), dispersing them by a homomixer or the like, and blending the cyanate ester compound (A) therewith. During the preparation of the resin composition, it is desired to add an organic solvent in order to decrease viscosity to improve handling properties and increase impregnation properties for glass cloth. During the preparation of this resin composition, known treatment (stirring, mixing, and kneading treatment and the like) for uniformly mixing the components can be performed. The above stirring, mixing, and kneading treatment can be appropriately performed, for example, using a known apparatus, such as an apparatus intended for mixing (a ball mill, a bead mill and the like) or a revolution and rotation mixing apparatus.

A prepreg in this embodiment is obtained by combining the above resin composition in this embodiment with a substrate, specifically, impregnating or coating a substrate with the above resin composition. The substrate used in the prepreg in this embodiment is not particularly limited, and can be appropriately selected and used from among, for example, known ones used for various printed wiring board materials, depending on the intended application and performance. Specific examples thereof include, but are not particularly limited to, woven fabrics of glass fibers, such as E-glass, T-glass, L-glass, D-glass, S-glass, NE-glass, Q-glass, UN-glass, and spherical glass, inorganic fibers other than glass, such as quartz, organic fibers, such as polyimides, polyamides, and polyesters, and liquid crystal polyesters. One substrate can be used alone, or two or more substrates can be used in appropriate combination.

As the shape of the substrate, woven fabrics, nonwoven fabrics, rovings, chopped strand mats, surfacing mats, and the like are known, and as the weave of the woven fabric, plain weave, basket weave, twill weave, and the like are known. Any may be used. In addition, the thickness of the substrate is not particularly limited, but is usually about 0.01 to 0.3 mm, and is, for example, preferably in the range of 0.01 to 0.2 mm in laminate applications. Among these substrates, particularly, glass fibers of E-glass are preferably used in laminate applications because of the balance between the expansion coefficient in the planar direction and workability.

For the above-described substrate, a surface-treated substrate is preferred in terms of adhesiveness to the resin and solder heat resistance properties after moisture absorption. For example, the surface of the substrate can be surface-treated with a silane coupling agent or the like. In addition, when a woven fabric is used as the substrate, the woven fabric is preferably a physically opened one in terms of adhesiveness to the resin. Further, when a film is used as the substrate, a film surface-treated by plasma or the like is preferred in terms of adhesiveness to the resin.

The prepreg in this embodiment can be fabricated according to an ordinary method, and the method for fabricating the prepreg is not particularly limited. As the method for fabricating a prepreg, a method including impregnating or coating a substrate with the above resin composition is generally known. More specifically, for example, the prepreg in this embodiment can be fabricated by impregnating or coating a substrate with a resin varnish obtained by adding an organic solvent to the above resin composition, and then heating the substrate with the resin varnish in a dryer at 100 to 200° C. for 1 to 60 minutes, or the like for semi-curing (B-staging). At this time, the amount of the resin composition adhered to the substrate, that is, the amount of the resin composition (including the first inorganic filler (C) and the second inorganic filler (D)) based on the total amount of the prepreg after the semi-curing, is preferably in the range of 40 to 95% by mass.

A laminate in this embodiment is obtained by lamination and molding using the above-described prepreg. In addition, a metal foil-clad laminate in this embodiment is obtained by laminating and molding the above-described prepreg and metal foil. Specifically, the metal foil-clad laminate in this embodiment can be fabricated by stacking one or a plurality of the above-described prepregs, disposing metal foil, such as copper or aluminum, on one surface or both surfaces of the stack as desired, and laminating them. The metal foil used here is not particularly limited as long as it is one used for a printed wiring board material. Copper foil, such as rolled copper foil and electrolytic copper foil, is preferred. Considering conductor loss in the high frequency region, electrolytic copper foil having small matte surface roughness is more preferred. In addition, the thickness of the metal foil is not particularly limited, but is preferably 2 to 70 μm, more preferably 2 to 35 μm. As the molding conditions, usual methods for laminates and multilayer boards for printed wiring hoards can be applied, and the molding conditions are not particularly limited. For example, molding is generally performed at a temperature in the range of 100 to 300° C. and a surface pressure in the range of 2 to 100 kgf/cm$^2$ with a heating time in the range of 0.05 to 5 hours using a multistage press, a multistage vacuum press, a continuous molding machine, an autoclave molding machine, or the like. In addition, a multilayer board can also be provided by laminating and molding the above prepreg and a separately fabricated wiring board for an inner layer in combination. Specifically, for example, a multilayer board can be fabricated by disposing copper foil on both surfaces of one of the above prepreg, laminating them under the above conditions, then forming inner layer circuits, subjecting the circuits to blackening treatment to form an inner layer circuit board, then alternately disposing the inner layer circuit boards and the above prepregs one by one, further disposing copper foil on the outermost layers, and laminating and molding them under the above conditions preferably under vacuum.

The above metal foil-clad laminate in this embodiment can be preferably used as a printed wiring board by forming a predetermined wiring pattern. The metal foil-clad laminate in this embodiment has high performance not only in thermal conductivity and moldability but also in glass transition temperature, metal foil peel strength, solder heat resistance, solder heat resistance properties after moisture absorption, water absorption rate, bending strength, elastic modulus, and the like, and therefore can be especially effectively used as a printed wiring board for a semiconductor package for which such performance is required.

The above printed wiring board can be manufactured, for example, by the following method. First, a metal foil-clad laminate, such as the above-described copper-clad laminate, is prepared. Next, a surface of the metal foil-clad laminate is subjected to etching treatment to form an inner layer circuit to fabricate an inner layer board. The inner layer circuit surface of this inner layer board is subjected to surface treatment for increasing adhesive strength, as required. Then, the required number of the above-described prepregs are stacked on the inner layer circuit surface, metal foil for an outer layer circuit is further laminated on the outside of the stack, and the laminate is heated and pressurized for integral molding. In this manner, a multilayer laminate in which an insulating layer comprising a substrate and a cured product of a thermosetting resin composition is formed between an inner layer circuit and metal foil for an outer layer circuit is manufactured. Then, this multilayer laminate is subjected to perforation for through holes and via holes, and then, a plated metal film that allows conduction between the inner layer circuit and the metal foil for an outer layer circuit is formed on the wall surface of this hole. Further, the metal foil for an outer layer circuit is subjected to etching treatment to form an outer layer circuit, and a printed wiring board is manufactured.

In this manner, a printed wiring board comprising an insulating layer and a conductor layer formed on a surface of this insulating layer can have a configuration in which the insulating layer comprises the resin composition in this embodiment described above. Specifically, for example, in the printed wiring board shown in the above manufacturing example, the prepreg in this embodiment described above (the substrate and the resin composition in this embodiment with which the substrate is impregnated or coated), and the resin composition layer of the metal foil-clad laminate in this embodiment described above (the layer comprising the resin composition in this embodiment) are composed of an insulating layer comprising the resin composition in this embodiment.

As described above, preferred methods for utilizing the resin composition in this embodiment have been described. However, the resin composition in this embodiment is not limited to those described above, and can also be effectively utilized, for example, in electrical insulating materials, sealing materials, adhesives, resist materials, and the like, and its applications are not particularly limited.

EXAMPLES

The present invention will be described in more detail below by giving Examples and Comparative Examples, but the present invention is not limited to these. "Parts" indicates "parts by mass" unless otherwise specified below.

Synthesis Example 1

0.47 moles (in terms of OH groups) of an α-naphthol aralkyl resin (SN495V, OH group equivalent: 236 g/eq., manufactured by Nippon Steel Chemical Co., Ltd.: including those in which the number of repeating units n of naphthol aralkyl was 1 to 5) was dissolved in 500 ml of chloroform in a reactor, and 0.7 moles of triethylamine was added to this solution. While the temperature was maintained at −10° C., 300 g of a chloroform solution of 0.93 moles of cyanogen chloride was dropped into the reactor over 1.5 hours. After the completion of the dropping, the mixture was stirred for 30 minutes. Then, a mixed solution of 0.1 moles of triethylamine and 30 g of chloroform was further dropped into the reactor, and the mixture was stirred for 30 minutes to complete the reaction. Hydrochloride of triethylamine produced as a by-product was filtered off from the reaction liquid. Then, the obtained filtrate was washed with 500 ml of 0.1 N hydrochloric acid, and then repeatedly washed with 500 ml of water four times. This was dried with sodium sulfate, followed by evaporation at 75° C. and further reduced pressure degassing at 90° C. to obtain a brown solid α-naphthol aralkyl-based cyanate ester compound represented by the above general formula (1), wherein all R was a hydrogen atom. The obtained α-naphthol aralkyl-based cyanate ester compound was analyzed by an infrared absorption spectrum. The absorption of the cyanate ester group around 2264 $cm^{-1}$ was confirmed.

Example 1

40 parts by mass of the α-naphthol aralkyl-based cyanate ester compound obtained in Synthesis Example 1, 20 parts by mass of bis(3-ethyl-5-methyl-4-maleimidephenyl)methane (BMI-70, manufactured by K.I Chemical Industry Co., Ltd.), 40 parts by mass of a biphenyl aralkyl-based epoxy resin (NC-3000-FH, manufactured by Nippon Kayaku Co., Ltd.), 15 parts by mass of a silane coupling agent (Z6040, manufactured by Dow Corning Toray Co., Ltd.), and 5 parts by mass of a wetting and dispersing agent comprising an acid group (BYK-W903, manufactured by BYK Japan KK) were dissolved and mixed in methyl ethyl ketone, and 500 parts by mass of spherical alumina having an average particle diameter of 3 μm (trade name: AX3-15, manufactured by Nippon Steel & Sumikin Materials Co., Ltd. Micron Co.), 100 parts by mass of nonspherical alumina having an average particle diameter of 3 μm (trade name: Advanced Alumina AA-3, manufactured by Sumitomo Chemical Co., Ltd.), 150 parts by mass of spherical alumina having an average particle diameter of 0.3 μm (trade name: ASFP-20, manufactured by DENKI KAGAKU KOGYO KABUSHIKI KAISHA), 0.01 parts by mass of NIKKA OCTHIX manganese (Mn 8%) (manufactured by Nihon Kagaku Sangyo Co., Ltd.), and 0.5 parts by mass of 2,4,5-triphenylimidazole (manufactured by TOKYO CHEMICAL INDUSTRY CO., LTD.) were mixed into the solution to prepare a resin varnish.

The average particle diameter is a value obtained by dispersing each inorganic filler in methyl ethyl ketone, then subjecting the dispersion to dispersion treatment by an ultrasonic homogenizer for 3 minutes, and measuring using a laser diffraction scattering particle size distribution measuring apparatus (manufactured by SHIMADZU CORPORATION).

The obtained resin varnish was further diluted with methyl ethyl ketone to provide a resin varnish having a solid concentration of 65 wt %. An E-glass cloth having a thickness of 0.05 mm (manufactured by Asahi Kasei E-materials Corp.) was impregnated and coated with this resin varnish, and heated and dried at 160° C. for 3 minutes to fabricate a 0.1 mmt prepreg.

Next, eight of the obtained prepregs were stacked, and 12 μm thick electrolytic copper foil (3EC-III, manufactured by Mitsui Mining & Smelting Co., Ltd.) was disposed on the upper and lower surfaces of the obtained laminate. The laminate with the electrolytic copper foil was subjected to vacuum pressing at a pressure of 30 kgf/$cm^2$ and a temperature of 220° C. for 120 minutes for lamination and molding to fabricate a metal foil-clad laminate (both surface copper-clad laminate) having a thickness of 0.8 mm.

Using the obtained metal-clad laminate, thermal conductivity, metal foil peel strength, solder heat resistance properties after moisture absorption, bending strength, elastic modulus, and appearance evaluations were performed.

(Measurement Methods and Evaluation Methods)

1) Thermal conductivity: The density of the obtained metal-clad laminate was measured, the specific heat was also measured by a DSC (TA Instruments model Q100), and the thermal diffusivity was further measured by a xenon flash analyzer (Bruker: LFA447 Nanoflash). Then, the thermal conductivity was calculated from the following formula.

$$\text{thermal conductivity (W/m·K)} = \text{density (kg/}m^3\text{)} \times \text{specific heat (kJ/kg·K)} \times \text{thermal diffusivity (}m^2\text{/S)} \times 1000$$

2) Peel strength: The peel strength was measured according to Test methods of copper-clad laminates for printed wiring boards, JIS C6481 (see 5.7 Peel Strength).

3) Solder heat resistance properties after moisture absorption: The metal foil-clad laminate was cut to a size of 50 mm×50 mm×0.8 mm by a dicing saw, and then, all the copper foil except half of the copper foil on one surface was removed by etching to obtain a test piece in which half of the copper foil remained only on one surface. This test piece was treated at 121° C. and 2 atmospheres by a pressure cooker tester (manufactured by HIRAYAMA MANUFACTURING CORPORATION, model PC-3) for 3 hours, and then immersed in a solder bath at 260° C. for 60 seconds, and then, appearance change was visually observed (the number of blisters that occurred/the number of tests).

4) Bending strength: The bending strength was measured by an autograph tester according to JIS K6911.

5) Elastic modulus: The elastic modulus was measured by an autograph tester according to JIS K6911.

6) Appearance evaluation: The obtained metal-clad laminate was cut to a size of 520 mm×340 mm×0.8 mm, and then, all the copper foil on both surfaces was removed by etching to obtain a sample (laminate) in which all the copper foil on the surfaces was removed. This laminate was visually observed, and one in which no voids occurred was evaluated as "Good (o)", and one in which voids occurred was evaluated as "Poor (x)".

7) Glass transition temperature: The glass transition temperature was measured according to JIS C6481 by a dynamic viscoelasticity analyzer (manufactured by TA Instruments) using a sample obtained by cutting the obtained metal foil-clad laminate to a size of 40 mm×20 mm×0.8 mm by a dicing saw.

Example 2

Operation was performed as in Example 1 except that the amount of the spherical alumina (AX3-15) blended was changed to 630 parts by mass, the amount of the spherical alumina (ASFP-20) blended was changed to 20 parts by mass, and the blending of the nonspherical alumina (AA-3) was omitted.

Example 3

Operation was performed as in Example 1 except that the amount of the silane coupling agent (Z6040) blended was changed to 5 parts by mass, the amount of the spherical alumina (AX3-15) blended was changed to 630 parts by mass, the amount of the spherical alumina (ASFP-20) blended was changed to 20 parts by mass, and the blending of the nonspherical alumina (AA-3) was omitted.

Comparative Example 1

Operation was performed as in Example 1 except that the amount of the silane coupling agent (Z6040) blended was changed to 5 parts by mass, the amount of the spherical alumina (AX3-15) blended was changed to 500 parts by mass, and the blending of the nonspherical alumina (AA-3) and the spherical alumina (ASFP-20) was omitted.

Comparative Example 2

Operation was performed as in Example 1 except that the amount of the spherical alumina (AX3-15) blended was changed to 650 parts by mass, and the blending of the nonspherical alumina (AA-3) and the spherical alumina (ASFP-20) was omitted.

Comparative Example 3

Operation was performed as in Example 1 except that the amount of the spherical alumina (AX3-15) blended was changed to 750 parts by mass, and the blending of the nonspherical alumina (AA-3) and the spherical alumina (ASFP-20) was omitted.

Comparative Example 4

Operation was performed as in Example 1 except that the blending of the spherical alumina (AX3-15) and the nonspherical alumina (AA-3) was omitted, and the amount of the spherical alumina (ASFP-20) blended was changed to 750 parts by mass.

TABLE 1

| | | Example 1 | Example 2 | Example 3 | Comparative Example 1 | Comparative Example 2 | Comparative Example 3 | Comparative Example 4 |
|---|---|---|---|---|---|---|---|---|
| Evaluation Item | Inorganic filler volume ratio [Vol %] | 70 | 67 | 67 | 61 | 67 | 70 | 70 |
| | Thermal conductivity xy-axis [W/m · K] | 3.0 | 2.8 | 2.8 | 2.0 | — | — | — |
| | Outer layer peel strength [kgf/cm] | 1.1 | 1.0 | 0.8 | 1 | — | — | — |
| | Solder heat resistance properties after moisture absorption [number of blisters that occurred/number of tests] | 0/4 | 0/4 | 0/4 | 0/4 | — | — | — |
| | Bending strength [Mpa] | 272 | 225 | 178 | 253 | — | — | — |
| | Elastic modulus [Gpa] | 37 | 38 | 34 | 29 | — | — | — |
| | Appearance evaluation | ○ | ○ | ○ | ○ | x | x | x |
| | Glass transition temperature [° C.] | 248 | 230 | 261 | 251 | — | — | — |

As shown in Table 1, it was confirmed that the metal foil-clad laminates of Examples 1 to 3 had higher thermal conductivity than the metal foil-clad laminate of Comparative Example 1. In addition, it was confirmed that the metal foil-clad laminates of Examples 1 to 3 had better moldability (appearance evaluation) than the metal foil-clad laminates of Comparative Examples 2 to 4. On the other hand, it was confirmed that the metal foil-clad laminate of Comparative Example 1 had significantly low thermal conductivity and poor elastic modulus. Further, it was confirmed that in the metal foil-clad laminates of Comparative Examples 2 to 4, voids occurred, and the moldability was poor.

This application claims priority from Japanese Patent Application No. 2011-243162 filed with the Japan Patent Office on Nov. 7, 2011, the content of which is incorporated herein by reference.

INDUSTRIAL APPLICABILITY

As described above, the resin composition of the present invention has excellent thermal conductivity and moldability, and therefore, can be widely and effectively utilized in various applications, such as electrical and electronic materials, machine tool materials, and aviation materials, for example, as electrical insulating materials, semiconductor plastic packages, sealing materials, adhesives, lamination materials, resists, and buildup laminate materials, and, particularly, can be especially effectively utilized as printed wiring board materials addressing higher integration and higher density. In addition, the laminate, metal foil-clad laminate, and the like of the present invention can have excellent performance not only in thermal conductivity and moldability but also in metal foil peel strength, solder heat resistance properties after moisture absorption, bending strength, elastic modulus, and glass transition temperature, and therefore, their industrial practicality is extremely high.

The invention claimed is:

1. A resin composition comprising at least a cyanate ester compound (A), an epoxy resin (B), a first inorganic filler (C), and a second inorganic filler (D), wherein an average particle diameter ratio of the first inorganic filler (C) to the second inorganic filler (D) is in the range of 1:0.02 to 1:0.2, and the second inorganic filler (D) has an average particle diameter of 0.3 to 2 μm, wherein the cyanate ester compound (A) is at least one selected from the group consisting of a naphthol aralkyl-based cyanate ester compound represented by the following general formula (1), a novolac-based cyanate ester compound represented by the following general formula (2), and a biphenyl aralkyl-based cyanate ester compound represented by the following general formula (3):

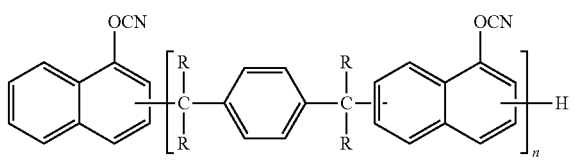
(1)

wherein R each independently represents a hydrogen atom or a methyl group, and n represents an integer of 1 to 50;

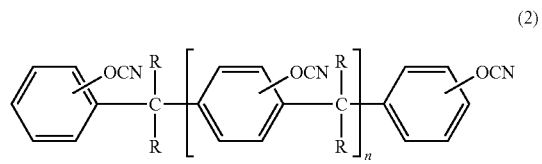
(2)

wherein R each independently represents a hydrogen atom or a methyl group, and n represents an integer of 1 to 50;

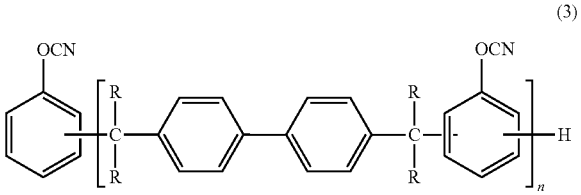
(3)

wherein R each independently represents a hydrogen atom or a methyl group, and n represents an integer of 1 to 50.

2. The resin composition according to claim 1, wherein a content ratio of the first inorganic filler (C) to the second inorganic filler (D) is in the range of 1:0.03 to 1:0.5.

3. The resin composition according to claim 1, wherein a total content of the first inorganic filler (C) and the second inorganic filler (D) is 351 to 900 parts by mass based on 100 parts by mass of a total of the cyanate ester compound (A) and the epoxy resin (B).

4. The resin composition according to claim 1, wherein a total content of the first inorganic filler (C) and the second inorganic filler (D) is 701 to 900 parts by mass based on 100 parts by mass of a total of the cyanate ester compound (A) and the epoxy resin (B).

5. The resin composition according to claim 1, wherein the first inorganic filler (C) has an average particle diameter of 1.5 to 10 μm.

6. The resin composition according to claim 1, wherein the second inorganic filler (D) is spherical.

7. The resin composition according to claim 1, wherein the second inorganic filler (D) is at least one selected from the group consisting of alumina, magnesium oxide, aluminum hydroxide, boron nitride, aggregated boron nitride, silicon nitride, a molybdenum compound, zinc borate, and aluminum nitride.

8. The resin composition according to claim 7, wherein the second inorganic filler (D) is at least one selected from the group consisting of alumina, magnesium oxide, boron nitride, and aluminum nitride.

9. The resin composition according to claim 1, wherein the first inorganic filler (C) and the second inorganic filler (D) are contained in an amount of 50% by volume or more and 80% by volume or less in total based on a total volume of the resin composition.

10. The resin composition according to claim 1, wherein the first inorganic filler (C) is one selected from the group consisting of alumina, magnesium oxide, aluminum hydroxide, boron nitride, aggregated boron nitride, silicon nitride, a molybdenum compound, zinc borate, and aluminum nitride.

11. The resin composition according to claim 10, wherein the first inorganic filler (C) is one selected from the group consisting of alumina, magnesium oxide, boron nitride, and aluminum nitride.

12. The resin composition according to claim 1, wherein the cyanate ester compound is the naphthol aralkyl-based cyanate ester compound represented by the above general formula (1).

13. The resin composition according to claim 1, wherein the cyanate ester compound (A) is contained in an amount of 10 to 90 parts by mass based on 100 parts by mass of the total of the cyanate ester compound (A) and the epoxy resin (B).

14. The resin composition according to claim 1, further comprising a silane coupling agent (E).

15. The resin composition according to claim 14, wherein the silane coupling agent is contained in an amount of 3 to 20 parts by mass based on 100 parts by mass of the total of the cyanate ester compound (A) and the epoxy resin (B).

16. The resin composition according to claim 1, further comprising a maleimide compound (F).

17. The resin composition according to claim 16, wherein the maleimide compound (F) is contained in an amount of 5 to 75 parts by mass based on 100 parts by mass of a total of the cyanate ester compound (A) and the maleimide compound (F).

18. A prepreg obtained by impregnating or coating a substrate with the resin composition according to claim 1.

19. A laminate obtained by curing the prepreg according to claim 18.

20. A metal foil-clad laminate obtained by laminating and curing the prepreg according to claim 18 and metal foil.

21. A printed wiring board comprising an insulating layer and a conductor layer formed on a surface of the insulating layer, wherein
   the insulating layer comprises the resin composition according to claim 1.

* * * * *